(12) United States Patent
Yoo

(10) Patent No.: US 6,335,897 B1
(45) Date of Patent: Jan. 1, 2002

(54) SEMICONDUCTOR MEMORY DEVICE INCLUDING REDUNDANCY CIRCUIT ADOPTING LATCH CELL

(75) Inventor: Jei-hwan Yoo, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/608,017

(22) Filed: Jun. 30, 2000

(30) Foreign Application Priority Data

Jul. 5, 1999 (KR) .............................................. 99-26853

(51) Int. Cl.$^7$ .............................. G11C 8/00; G11C 7/00
(52) U.S. Cl. .............................. 365/230.03; 365/225.7; 365/200
(58) Field of Search .......................... 365/230.03, 200, 365/154, 225.7, 189.09

(56) References Cited

U.S. PATENT DOCUMENTS

| | | | |
|---|---|---|---|
| 5,060,197 A | * 10/1991 | Park et al. | 365/200 |
| 5,355,339 A | * 10/1994 | Oh et al. | 365/200 |
| 5,495,445 A | * 2/1996 | Proebsting | 365/200 |
| 5,572,471 A | * 11/1996 | Proebsting | 365/200 |
| 5,596,536 A | * 1/1997 | Koh | 365/200 |
| 5,657,280 A | * 8/1997 | Shin et al. | 365/200 |
| 6,122,207 A | * 9/2000 | Koshikawa et al. | 365/200 |

FOREIGN PATENT DOCUMENTS

| | | |
|---|---|---|
| JP | 7078492 | 3/1995 |
| JP | 7254298 | 10/1995 |
| JP | 8263990 | 10/1996 |

\* cited by examiner

Primary Examiner—Richard Elms
Assistant Examiner—Anh Phung
(74) Attorney, Agent, or Firm—Volentine Francos, PLLC

(57) ABSTRACT

A semiconductor memory device including a redundancy circuit having latch cells is provided. In the semiconductor memory device, memory cells are selected in memory cell blocks each having a plurality of memory cells arrayed in columns and rows. Data of the selected memory cells is input to or output from the memory cell blocks via data lines. The semiconductor memory device includes a row decoder, a sub word line driver, latch cells, fuse boxes, a latch cell control unit, and a switch unit. The row decoder decodes a row address and generates a word line enable signal for selecting the word lines of a group of memory cells among memory cells. The sub word line driver is connected to the word line enable signal, and drives the selected memory cells. The latch cells are arranged along the data lines. Each of the fuse boxes has a plurality of fuses which are programmed in accordance with a defective cell address in the memory cell block. The latch cell control unit generates a latch cell selection signal in response to the output signal of each of the fuse boxes, and selects latch cells. The switch units connect the selected latch cells to the data lines in response to the latch cell selection signal.

18 Claims, 6 Drawing Sheets

SEMICONDUCTOR MEMORY DEVICE INCLUDING REDUNDANCY CIRCUIT ADOPTING LATCH CELL

The present application claims priority under 35 U.S.C. §119 to Korean Application No. 99-26853 filed on Jul. 5, 1999, which is hereby incorporated by reference in its entirety for all purposes.

BACKGROUND OF THE INVENTION

1. Field of the Invention

The present invention relates to a semiconductor memory device, and more particularly, to a semiconductor memory device including a redundancy circuit which adopts a latch cell.

2. Description of the Related Art

Recently, with the development of refining techniques, semiconductor devices have become faster and more highly integrated. In particular, semiconductor memory devices require high yield together with high integration.

Semiconductor memory devices are comprised of many memory cells. However, even if one of the memory cells is defective, the semiconductor memory device no longer operates properly. With an increase in the integration of semiconductor memory devices, the possibility that defects may be generated in memory cells increases. Such defective memory cells deteriorates the function of a semiconductor memory device, thus becoming one of the main factors in lowering the yield of semiconductor memory devices. Therefore, a technique for installing a redundancy circuit for improving yield by replacing a defective cell with a redundant cell is widely used.

Generally, the redundancy circuit drives spare redundancy memory cell blocks arranged in columns and rows, and selects a redundant memory cell in the redundancy memory cell block to replace the defective cell. A method of replacing defective columns or rows including defective cells with redundant columns or rows within a redundancy memory cell block is typically used as a method of replacing defective cells. That is, if an address signal addressing a defective cell is input to the redundancy circuit, a fuse connected to a defective column and/or row is cut, so that a redundant column and/or row within the redundancy memory cell block is selected instead of the defective column and/or row.

However, in this method of using a redundancy memory cell block, when one defective cell is generated within a defective column and/or row, even the remaining non-defective cells connected to the defective column and/or row are replaced with redundancy cells within a redundant column and/or row in order to repair one defective cell. The unnecessary use of redundant memory cells, which can be used to replace other defective cells, even with a predetermined restricted redundant memory cell capacity, causes loss of redundancy efficiency. Also, when the redundancy memory cell capacity is increased to improve the redundancy efficiency, a chip is enlarged by the increasing area of a redundancy memory cell block.

Thus, a redundancy circuit for effectively repairing defective cells is required to replace the defective cells with redundant cells.

SUMMARY OF THE INVENTION

An object of the present invention is to provide a semiconductor memory device including a redundancy circuit for repairing defective cells using latch cells which are arrayed on a data line, which substantially overcomes one or more of the problems due to limitations and disadvantages of the related art.

Accordingly, to achieve the above objects, the present invention provides a semiconductor memory device in which data of memory cells arrayed in columns and rows in each memory block is input to or output from data lines, wherein when the selected memory cells are defective, latch cells are included on the data lines to replace the defective cells in response to the addresses of the defective cells.

In an embodiment, the semiconductor memory device includes a row decoder, a sub word line driver, latch cells, fuse boxes, a latch cell control unit, and a switch unit. The row decoder decodes a row address and generates a word line enable signal for selecting the word lines of a group of memory cells among the memory cells. The sub word line driver is connected to the word line enable signal, and selects a single memory cell from the group of memory cells. The latch cells are arranged in parallel along the data lines. Each of the fuse boxes has a plurality of fuses which are programmed corresponding to the addresses of defective memory cells. The latch cell control unit generates a plurality of latch cell selection signals in response to the output signal of each of the fuse boxes, and selects latch cells. The switch units connect the selected latch cells to the data lines in response to the latch cell selection signal. In the semiconductor memory device, at least two latch cells connected in parallel to each other along each of the data lines replace the defective cells using at least one fuse box.

As described above, a defective cell is replaced by a latch cell that is included in a redundancy unit, so that loss of redundancy efficiency is prevented. Also, a semiconductor memory device according to the present invention does not require a conventional redundancy memory cell block, so that the size of a chip is reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
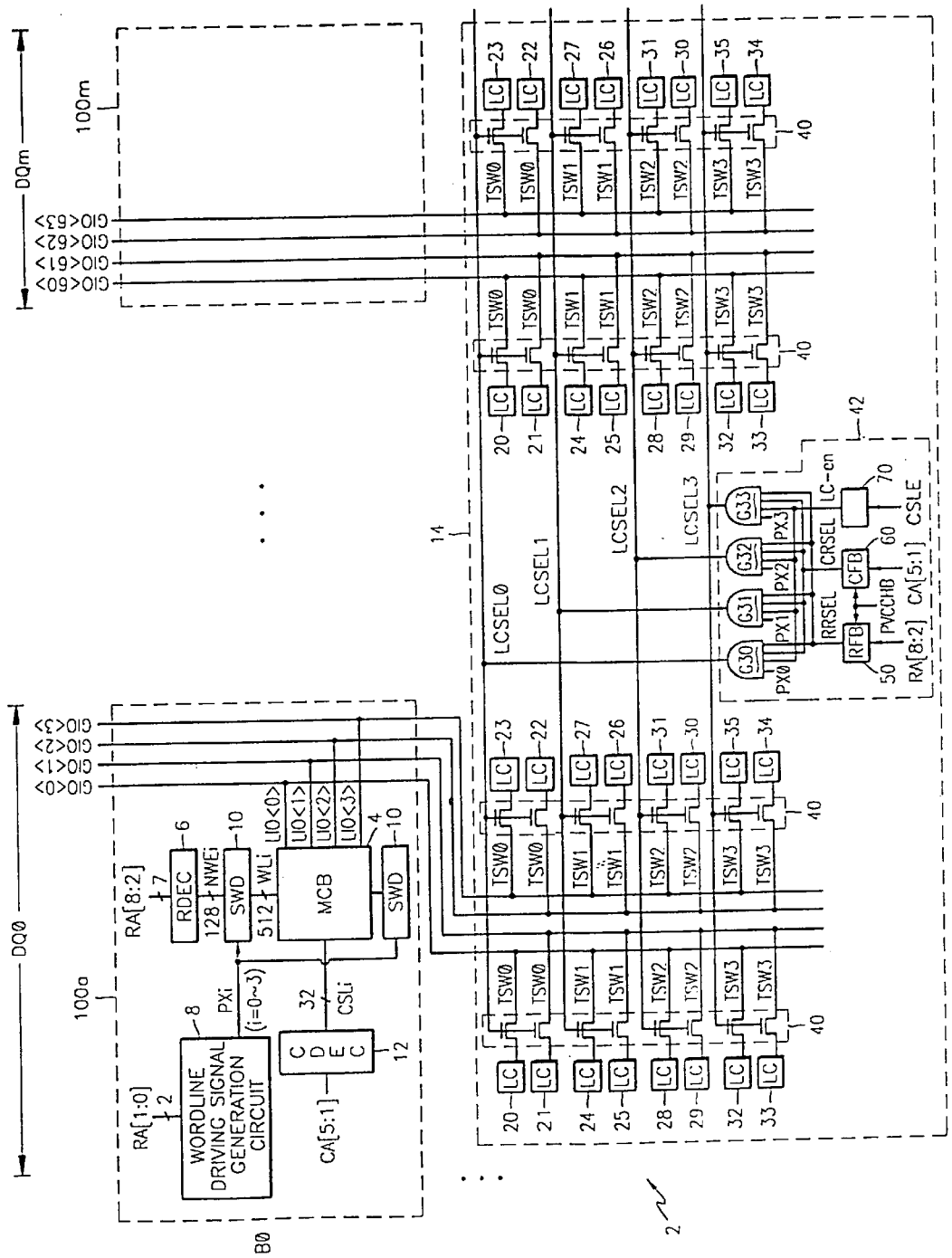
FIG. 1 is a block diagram illustrating an embodiment of a semiconductor memory device including a redundancy circuit which adopts latch cells, according to an embodiment of the present invention.

The attached drawings for illustrating a preferred embodiment of the present invention, and the contents written on the attached drawings must be referred to in order to gain a sufficient understanding of the merits of the present invention and the operation thereof and the objectives accomplished by the operation of the present invention.

Hereinafter, the present invention will be described in detail by explaining preferred embodiments thereof with reference to the attached drawings. Like reference numerals in the drawings denote the same members. The present specification describes a Rambus DRAM which is widely used of late. A Rambus DRAM has a plurality of banks B0, . . . which are aligned in the row direction, and DQ blocks DQO through DQM which are aligned in the column direction of each bank and share a group of global data lines GIO<i> (where i is 0 to 3). The number of global data lines GIO<i> (where i is 0 to 3) can vary with the memory architecture of a Rambus DRAM. The present embodiments take four global data lines GIO<i> (where i is 0 to 3) as an example.

In FIG. 1 illustrating an embodiment of a semiconductor memory device including a redundancy circuit which adopts a latch cell structure, according to the present invention, only one bank B0 and two DQ blocks DQO and DQm within the bank B0 are shown for simple description. The structure of the embodiment shown in FIG. 1 is the same as a general DRAM except for a redundancy circuit 14 having a latch cell structure. Referring to FIG. 1, a semiconductor memory device 2 includes a memory cell block 4, a row decoder 6, a word line driving signal generation circuit 8, a sub word line driver 10, a column decoder 12, and the redundancy circuit 14.

The memory cell block 4 has a plurality of memory cells which are arranged in columns and rows, for example, 512 word lines and 256 bit lines. The row decoder 6 decodes an externally-input row address RA[8:2] and provides 128 word line enable signals NWEi. The word line driving signal generation circuit 8 decodes an externally-input least significant row address RA[1:0] and provides 4 word line driving signals PXi (where i is 0 to 3). Each of the 128 word line enable signals NWEi is provided to the sub word line driver 10 which responds to the four word line driving signals PXi (where i is 0 to 3), and selects one word line among 512 word lines WL within the memory cell block 4. The sub word line driver 10 is shown in FIG. 2.

Figure 2:
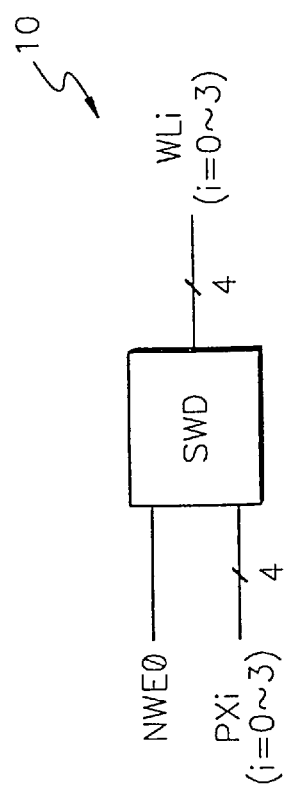
FIG. 2 is a circuit diagram of the sub word line driver of FIG. 1.

In the sub word line driver 10 of FIG. 2, a word line enable signal NWE0 among the 128 word line enable signals NWEi provided from the row decoder 6 is controlled by the four word line driving signals PXi (where i is 0 to 3), and activates one word line among the four word lines WL0 through WL3.

This division driving method of activating a word line WL0 in response to the four word line driving signals PXi (where i is 0 to 3) and a word line enable signal NWE0 which is activated by the row decoder 6, minimizes delay due to the load of a word line which inevitably increases with the capacity of the memory. The four word line driving signals PXi (where i is 0 to 3) which are related to a word line enable signal NWE0 indicate that defective cells are repaired in redundancy units of four cells.

In FIG. 1, the column decoder 12 decodes five column addresses CA[5:1] which are required to simultaneously select four pairs of bit lines from 256 bit lines, and generates 32 column selection signals CSLi. Thus, data of four memory cells selected by one word line WL and the column selection signals CSLi is transmitted to the global data lines GIO<i> (where i is 0 to 3) via local data lines LIO<i> (where i is 0 to 3).

If a selected memory cell within the memory cell block 4 of the block DQ0 is defective, the redundancy circuit 14 is required to repair the defective memory cell. The redundancy circuit 14 includes latch cells 20, 21, . . . , 34 which are arranged adjacent to the global data lines GIO<i> (where i is 0 to 3). The redundancy circuit 14 also includes switch units 40 for connecting the latch cells 20, 21, . . . , 34 to the global data lines GIO<i> (where i is 0 to 3), and a latch cell control unit 42 for generating latch cell selection signals LCSEL0 through LCSEL3 for controlling the switch units 40. In the redundancy circuit 14, the number of latch cell control units 42 can be varied according to the redundancy scheme. But for convenience, only one latch cell control unit 42 is described and illustrated.

Figure 3:
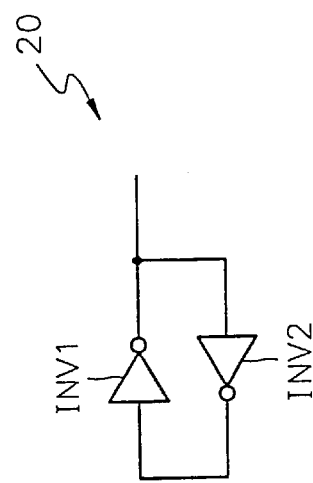
FIG. 3 is a circuit diagram of a latch cell of FIG. 1.

Each of the latch cells 20, 21, . . . , 34 can be implemented so that they can store data. As shown in FIG. 3, the latch cell 20 can be constituted of two inventors INV1 and INV2 which form a closed circuit by connecting the input port of one inverter to the output port of the other inverter and vice versa.

The switch units 40 include NMOS transistors TSW0 through TSW3, and connect the latch cells 20, 21, . . . , 34 to the global data lines GIO<i> (where i is 0 to 3) in response to a high level of the latch cell selection signals LCSEL0 through LCSEL3.

The latch cell control unit 42 includes a row fuse box 50, a column fuse box 60, and a latch cell selection enable signal generator 70. The row fuse box 50 and the column fuse box 60 respond to a power-up signal PVCCHB, and are connected to a row address RA[8:2] and a column address CA[5:1], respectively. The latch cell selection enable signal generator 70 generates a latch cell selection enable signal in response to a column selection enable signal CSLE for inducing a column selection signal CSLi. The latch cell control unit 42 generates latch cell selection signals LCSELi (where i is 0 to 3) in response to the word line driving signal PXi (where i is 0 to 3), and the outputs of the row fuse box 50, column fuse box 60 and latch cell selection enable signal generator 70.

Figure 4:
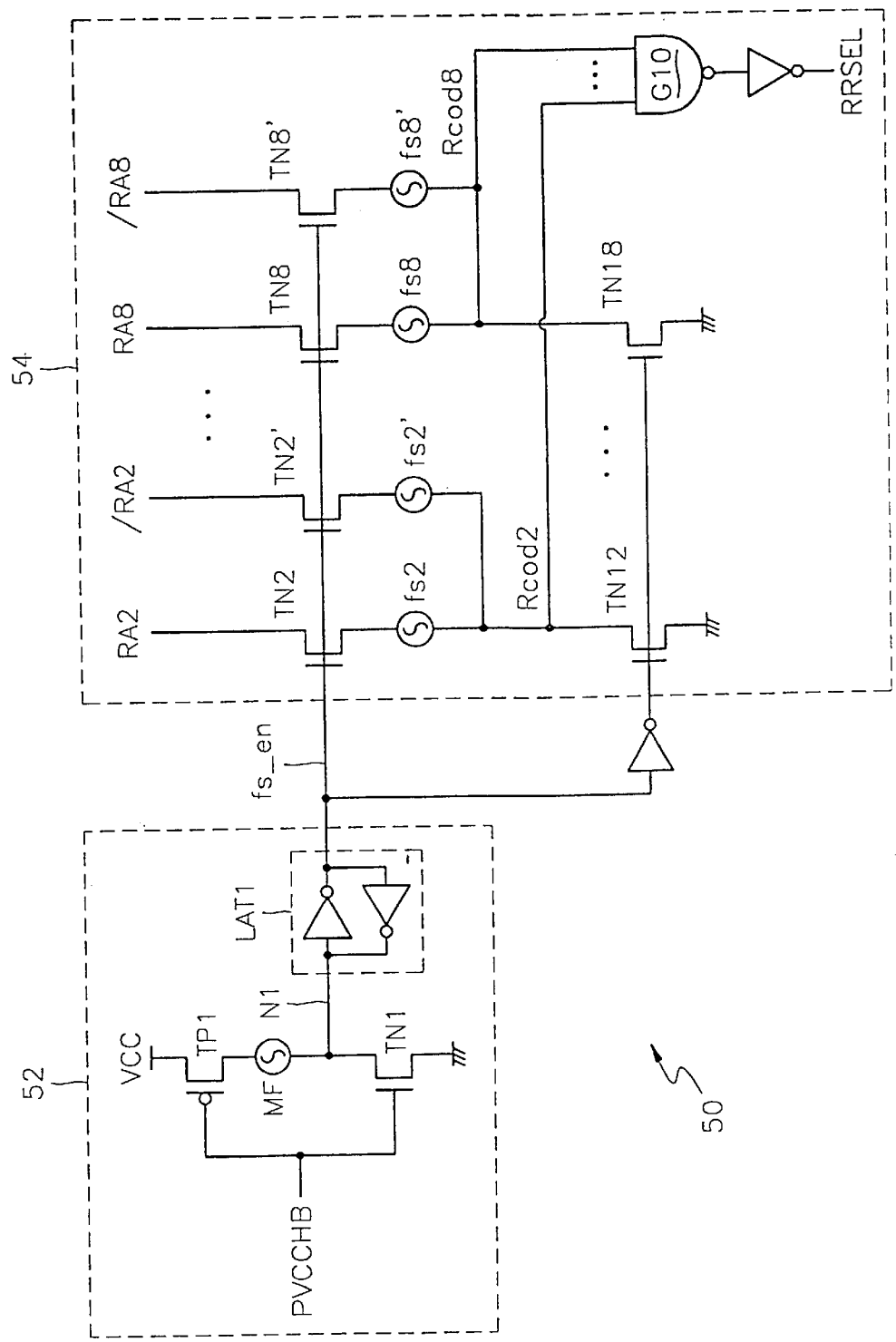
FIG. 4 is a circuit diagram of the row fuse box unit of FIG. 1.

The row fuse box 50 is shown in detail in FIG. 4, which includes a row redundancy enable unit 52 and a row redundancy coding unit 54. To be more specific, the row redundancy enable unit 52 includes a PMOS transistor TP1, an NMOS transistor TN1, a main fuse MF and a latch LAT1. The PMOS transistor TP1 has a gate to which the power-up signal PVCCHB is connected, and a source to which a power supply voltage VCC is connected. The NMOS transistor TN1 has a gate to which the power-up signal PVCCHB is connected, and a source to which a ground voltage VSS is connected. The main fuse MF is interposed between the drain of the PMOS transistor TP1 and the drain of the NMOS transistor TNI. A node N1 connected to the drain of the NMOS transistor TN1 and one port of the main fuse MF is connected to a fuse enable signal fs_en via the latch LAT1.

When the power supply voltage VCC is applied, the power-up signal PVCCHB has a "high" level until the level of the applied power supply voltage rises to a predetermined voltage level, and then has a "low" level when the level of the power supply voltage VCC is greater than or equal to the predetermined voltage level. Thus, the NMOS transistor TN1 is turned on in response to a "high" level power-up signal PVCCHB, so that the node N1 is initialized to the "low" level of a ground voltage. When the voltage level of the node N1 is "low", the voltage level thereof passes through the latch LAT1 to make the fuse enable signal fs_en go to a "high" level. Thereafter, when the power-up signal PVCCHB goes to a "low" level, the PMOS transistor TP1 is turned on, and the voltage level of the node N1 goes to the "high" level of the power supply voltage VCC through the main fuse MF. When the voltage level of the node N1 is "high", the voltage level thereof passes through the latch LAT1 to make the fuse enable signal fs_en go to a "low" level. A "low" level fuse enable signal fs_en controls the NMOS transistors TN12, . . . , TN18 within the row redundancy coding unit 54 so that they do not perform a row redundancy enable operation.

In order to perform a row redundancy enable operation, first, the main fuse MF is cut. Thus, the node N1 is disconnected from the power supply voltage VCC. Once the power-up signal PVCCHB rises to a "high" level while the power supply voltage VCC is applied, the node N1 is initialized to a "low" level. Then, when the power-up signal PVCCHB is activated to a "low" level, the NMOS transistor TN1 is turned off, and the PMOS transistor TP1 is turned on. However, the node N1 is no longer supplied with the power supply voltage (VCC) because the main fuse MF is cut. Therefore, the initial "low" level of the node N1 can be maintained by virtue of the structure of the latch LAT1, and the fuse enable signal fs_en can also be maintained at a "high" level by virtue of the structure of the latch LAT1.

The row redundancy coding unit 54 includes NMOS transistors TN2, TN2', . . . , TN8 and TN8', NMOS transistors TN12, . . . , TN18, and a plurality of fuses fs2, fs2', . . . , fs8, and fs8'. Here, the NMOS transistors TN2, TN2', . . . , TN8 and TN8' have gates to which the fuse enable signal fs_en is connected, and sources S to which row addresses RA2, /RA2, . . . , RA8 and /RA8 are connected. The NMOS transistors TN12, . . . , TN18 have gates to which the inverted signal of the fuse enable signal fs_en is connected, and sources to which a ground voltage VSS is connected. The plurality of fuses fs2, fs2'. . . , fs8, and fs8' are interposed between the drains of the NMOS transistors TN2, TN2', . . . , TN8 and TN8' and the drains of the NMOS transistors TN12, . . . , TN18.

In the row redundancy coding unit 54, the plurality of fuses fs2, fs2', . . . , fs8, and fs8' are selectively cut and coded in accordance with row addresses RA2, /RA2, RA8 and /RA8 of a defective cell within the memory cell block 4 of FIG. 1. That is, only fuses fs2, fs2', . . . , fs8, and fs8' which correspond to the "low" level row addresses RA[8:2] and /RA[8:2] are coded to be cut. In this state, the NMOS transistors TN2, TN2', . . . , TN8 and TN8' are turned on by a "high" level fuse enable signal fs_en. At this time, "low" and "high" level row addresses RA[8:2] and /RA[8:2] pass through the turned-on NMOS transistors TN2, TN2', . . . , TN8 and TN8', and the cut fuses prevent the "low" level row addresses RA[8:2] and /RA[8:2] from being transmitted to row redundancy coding signals Rcod2, . . . , Rcod8. However, only "high" level row addresses RA[8:2] and /RA[8:2] are transmitted as the row redundancy coding signals Rcod2, . . . , Rcod8. The output of a NAND gate G10 goes to a "low" level in response to "high" level row redundancy coding signals Rcod2, . . . , Rcod8. Then, the "low" level output of the NAND gate G10 is inverted, so that the row redundancy selection signal RRSEL goes to a "high" level. The "high" level row redundancy selection signal RRSEL is provided to AND gates G30, G31, G32 and G33 within the latch cell control unit 42 of FIG. 1, and activates latch cell selection signals LCSELi (where i is 0 to 3).

Meanwhile, in the row redundancy coding unit 54, the NMOS transistors TN12, . . . , TN18 are turned on in response to a "low" level fuse enable signal fs_en, so that the row redundancy coding signals Rcod2, . . . , Rcod8 go to a "low" level regardless of the coding state of the fuses fs2, fs2', . . . , fs8, and fs8'. The row redundancy selection signal RRSEL goes to a "low" level in response to "low" level row redundancy coding signals Rcod2, . . . , Rcod8, and are provided to the AND gates G30, G31, G32 and G33 in the latch cell control unit 42 of FIG. 1, thus deactivating the latch cell selection signals LCSELi (where i is 0 to 3).

Figure 5:
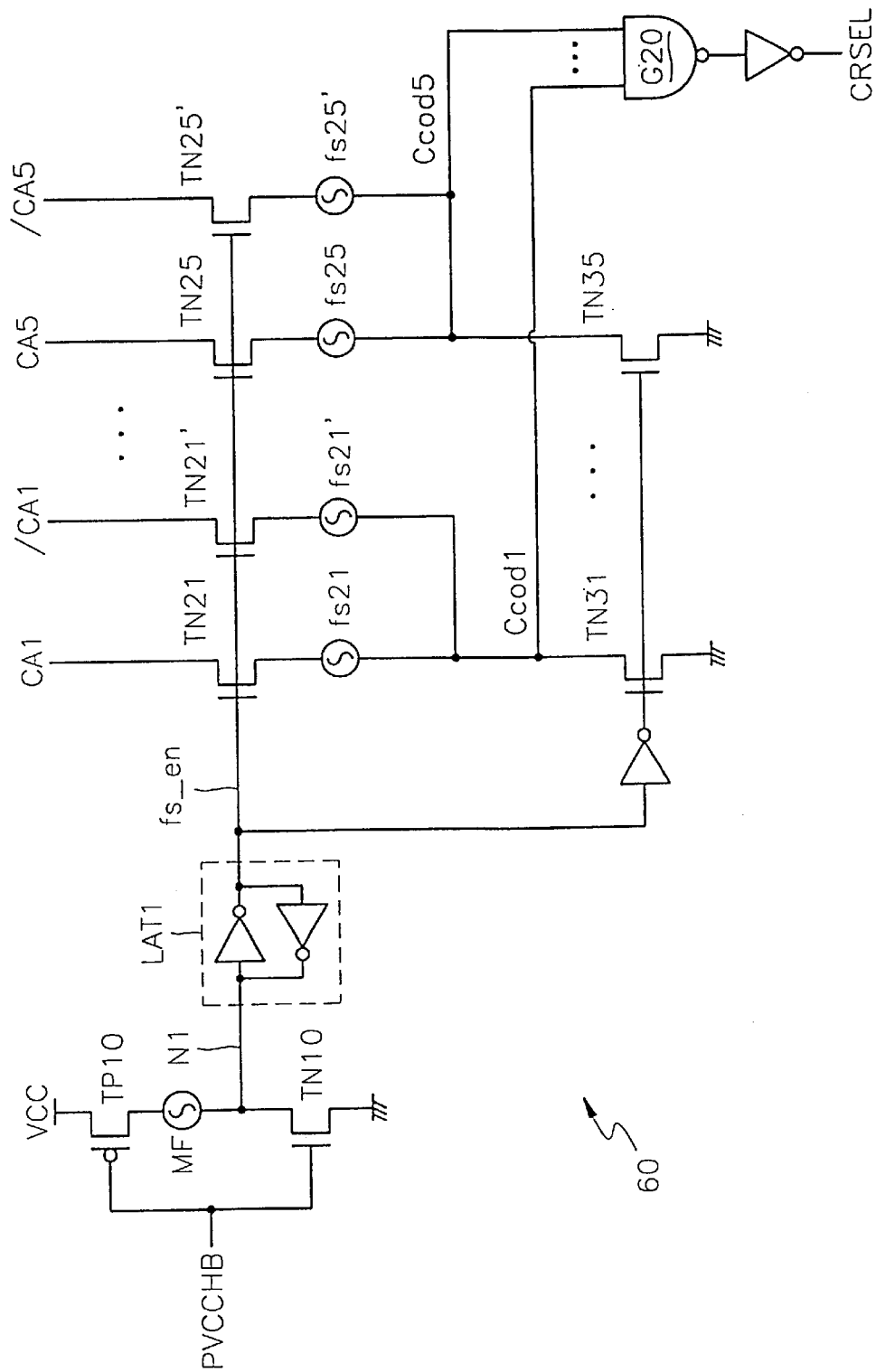
FIG. 5 is a circuit diagram of the column fuse box unit of FIG. 1.

FIG. 5 shows the column fuse box unit 60 of FIG. 1 in more detail. The operation of the column fuse box unit 60 is the same as that of the row fuse box unit 50 of FIG. 4, except that the column fuse box unit 60 is connected to a column address CA[5:1] rather than the row address RA[8:2] of FIG. 4, and fuses fs21, fs21', . . . , fs25, and fs25' are selectively cut in accordance with the column address CA[5:1]. Thus, the operation of the column fuse box unit 60 will not be described in detail.

In the column fuse box unit 60, a "high" level fuse enable signal fs_en is generated in response to the transition of the power-up signal PVCCHB to a "low" level, when the main fuse MF is cut, and column redundancy coding signals Ccod1, . . . , Ccod5 become at a "high" level in response to the "high" level fuse enable signal fs_en and according to a column address CA[5:1] and the coding state of the fuses fs21, fs21', . . . , fs25, and fs25'. Thus, the column redundancy selection signal CRSEL goes to a "high" level. A "high" level column redundancy selection signal CRSEL is also provided to the AND gates G30, G31, G32 and G33 in the latch cell control unit 42 of FIG. 1, and activates the latch cell selection signals LCSELi (where i is 0 to 3).

Also, in the column fuse box unit 60, the NMOS transistors TN31, . . . , TN35 are turned on in response to a "low" level fuse enable signal $fs_{13}$ en, so that the column redundancy coding signals Ccod1, . . . , Ccod5 goes to a "low" level. Thus, the column redundancy selection signal CRSEL goes to a "low" level, and is provided to the AND gates G30, G31, G32 and G33 in the latch cell control unit 42 of FIG. 1, thus deactivating the latch cell selection signals LCSELi (where i is 0 to 3) to a "low" level.

Figure 6:
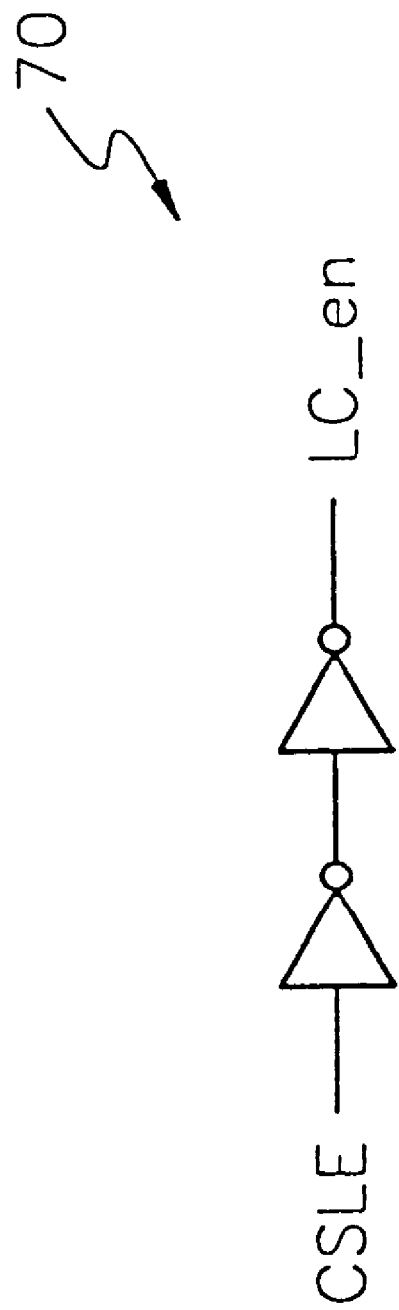
FIG. 6 is a circuit diagram of the latch cell selection enable signal generator of FIG. 1.

Referring to FIG. 6, the latch cell selection enable signal generator 70 generates a "high" level latch cell selection enable signal LC_en in response to a "high" level column selection enable signal CSLE for activating column selection signals CSLi. Accordingly, the latch cell selection enable signal LC_en is set to be simultaneously activated with the column selection signal CSLi for selecting a memory cell from memory cells within the memory cell block 4 of FIG. 1. The "high" level latch cell selection enable signal LC_en is provided to the AND gates G30, G31, G32 and G33 in the latch cell control unit 42 of FIG. 1, and activates the latch cell selection signals LCSELi (where i is 0 to 3).

Referring back to FIG. 1, the latch cell control unit 42 generates the latch cell selection signals LCSELi (where i is 0 to 3) via the AND gates G30, G31, G32 and G33 which respond to the row redundancy selection signal RRSEL, the column redundancy selection signal CRSEL, the latch cell selection enable signal LC_en, and the word line driving signals PXi (where i is 0 to 3). As described above, the row redundancy selection signal RRSEL and the column redundancy selection signal CRSEL, which are generated with respect to the row and column addresses RA[8:2] and CA[5:1] which indicate a defective cell, are activated to a "high" level, similar to when the word line enable signals NWEi and the column selection signals CSLi which select a defective cell are activated. The latch cell selection enable signal LC_en is also activated to a "high" level when the column selection signals CSLi for selecting a defective cell are activated.

In the sub word line driver 10 of FIG. 1, the word line enable signals NWEi for selecting a defective cell are connected to four word line driving signals PXi (where i is 0 to 3) as described above, such that the four word line driving signals PXi (where i is 0 to 3) are also connected to the AND gates G30, G31, G32 and G33 in the latch cell control unit 42 in order to designate a defective cell. However, only one signal among the four word line driving signals PXi (where i is 0 to 3) is activated to a "high" level, and in response, only one signal among the latch cell selection signals LCSELi (where i is 0 to 3), which are the outputs of the AND gates G30, G31, G32 and G33, is activated to a "high" level. When the latch cell selection signal is at a "high" level, the transistors TSWO in the switch unit 40 are turned on to connect latch cells 20, 21, 22 and 23 to the global data lines GIO<i> (where i is 0 to 3). In this way, a defective cell is replaced by the latch cells 20, 21, 22 and 23. Here, the number of latch cells, which is four, is set to match the number of memory cell data which is simultaneously input to or output from the global data lines GIO<i> (where i is 0 to 3) by a certain address signal, and the four latch cells constitute a redundancy unit for replacing defective cells.

However, in the redundancy circuit for replacing defective cells with latch cells, according to the present invention, when the row and column addresses RA[8:0] and CA[5:1] for indicating a defective cell are received, defective cells are selected in the memory cell block 4, and the latch cells 20, 21, 22 and 23 are also selected within the redundancy circuit 14. Thus, data provided by the defective cells collide with data provided by the latch cells, on the global data lines GIO<i> (where i is 0 to 3). However, latch cells are arranged on the global data lines GIO<i> (where i is 0 to 3), such that latch cell data has a strong strength even if it collides with defective cell data. Thus, the latch cell data is transmitted via the global data lines GIO<i> (where i is 0 to 3).

When defective cells existing in the block DQ0 are replaced by the latch cells 20, 21, 22 and 23, memory cells corresponding to an address indicating defective cells within blocks DQ0, . . . , DQm for a bank B0 are replaced by the four latch cells 20, 21, 22 and 23 constituting the redundancy unit.

In the present invention as described above, latch cells of a redundancy unit are selected to replace a defective cell, thus preventing the loss of redundancy efficiency due to replacement of a redundancy row and/or column according to a conventional method of replacing defective cells. Also, a semiconductor memory device according to the present invention does not require a redundancy memory cell block. Therefore, the area occupied by a conventional redundancy memory cell block is saved, so that the size of a chip is reduced.

Figure 7:
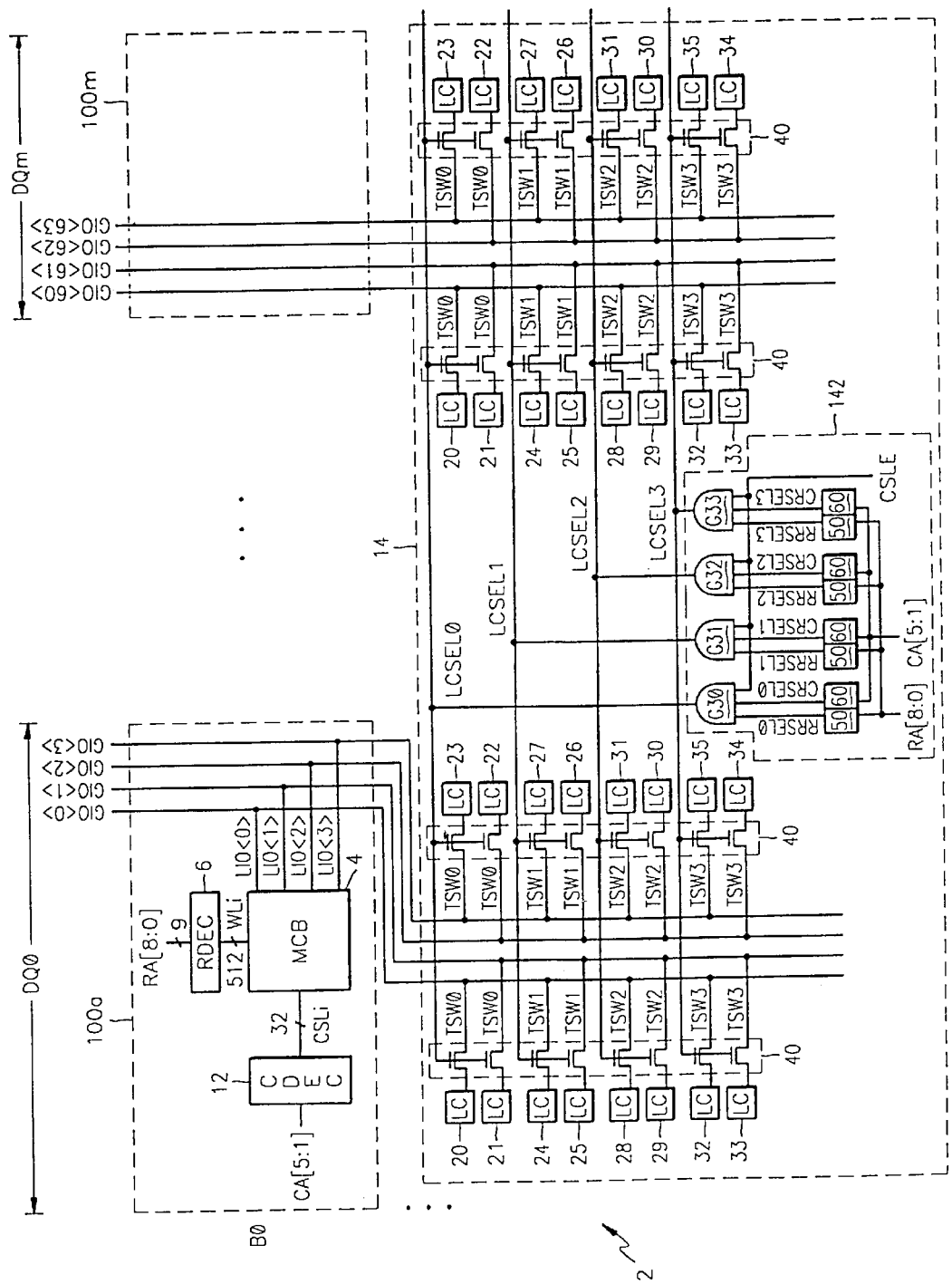
FIG. 7 is a block diagram illustrating another embodiment of a semiconductor memory device including a redundancy circuit which adopts latch cells, according to the present invention.

FIG. 7 illustrates another embodiment of a semiconductor memory device including a redundancy circuit having a latch cell structure, according to the present invention. The operation of the embodiment shown in FIG. 7 is the same as that of the embodiment shown in FIG. 1, except that the embodiment of FIG. 7 does not include the word line driving signal generation circuit 8 and sub word line driver 10 in the embodiment of FIG. 1, all row addresses RA[8:0] are input to a row decoder 6 without being divided into a row address RA[1:0] and a row address RA[8:2], and the word line driving signals PXi (where i is 0 to 3) are not required as the input signals of the AND gates G30, G31, G32 and G33 in the latch cell control unit 142. Thus, the semiconductor memory device according to this embodiment of the present invention will not be described in detail.

In the semiconductor memory according to this embodiment of the present invention, memory cells are selected in the memory cell block 4 in response to word lines WL which are output by the row decoder 6 which receives all of the row addresses RA[8:0], and column selection signals CSLi which are output by the column decoder 12 which receives a column address CA[5:1]. When selected memory cells are defective, a plurality of fuses in the row fuse box 50, which receives the row address RA[8:0], in the redundancy control unit 142, are cut in accordance with the row address of a defective cell, and a plurality of fuses in the column fuse box 60 which receives the column address CA[5:1] are cut in accordance with the column address of the defective cell. Then, the latch selection signals LCSELi (where i is 0 to 3) are activated in response to the column selection enable signal CSLE, the row redundancy selection signals RRSELi (where i is 0 to 3) provided by the row fuse box 50, and the column redundancy selection signals CRSELi (where i is 0 to 3) provided by the column fuse box 60, thus connecting the latch cells 20, 21, . . . , 34 to the global data lines GIO<i> (where i is 0 to 3). In this way, defective cells are replaced by the latch cells 20, 21, . . . , 34. Also, in this embodiment, the number of latch cells connected to the global data lines GIO<i> (where i is 0 to 3), which is four, is set to match the number of memory cells which are simultaneously input to or output from the global data lines GIO<i> (where i is 0 to 3), and the four latch cells 20, 21, 22 and 23 constitute a redundancy unit for replacing defective cells.

In these embodiments of the redundancy circuit according to the present invention, a DQ block DQ0 including a redundancy circuit is described for simple depiction. However, each of the DQ blocks DQ0 through DQm may include a plurality of redundancy circuits. That is, although the invention has been described with reference to a particular embodiment, it will be apparent to one of ordinary skill in the art that modifications of the described embodiment may be made without departing from the spirit and scope of the invention.

What is claimed is:

1. A semiconductor memory device comprising:
a plurality of memory blocks, each including memory cells arranged in columns and rows;
a plurality of data lines coupled to said plurality of memory blocks, data being input to and output from the memory cells in said plurality of memory blocks via said plurality of data lines; and
a plurality of latch cells disposed on said plurality of data lines, said plurality of latch cells replacing only defective memory cells within said plurality of memory blocks in response to addresses of the defective memory cells.

2. The semiconductor memory device of claim 1, wherein each of said plurality of latch cells comprises first and second inverters which form a closed circuit, wherein an input port of the first inverter is coupled to an output port of the second inverter and an input port of the second inverter is connected to an output port of the first inverter.

3. A semiconductor memory device including a plurality of memory blocks each having memory cells arrayed in columns and rows, data being input to and output from memory cells in the memory blocks via data lines, the semiconductor memory device comprising:

latch cells arranged along the data lines;

fuse boxes each having a plurality of fuses which are programmed in accordance with an address of a defective memory cell; and switch units coupled to said latch cells, said switch units selecting said latch cells in response to output signals of said fuse boxes and connecting said latch cells to the data lines.

4. The semiconductor memory device of claim 3, wherein each of said fuse boxes includes a row fuse box and a column fuse box which are respectively connected to a row address and a column address which specify a memory cell.

5. The semiconductor memory device of claim 3, wherein each of said fuse boxes comprises:

a redundancy enable unit that generates a fuse enable signal in response to a power-up signal that represents a power state of the semiconductor memory device, when a main fuse in said redundancy enable unit is cut; and a redundancy coding unit coupled to said redundancy enable unit, said redundancy coding unit generating a redundancy selection signal in response to the fuse enable signal and based on the plurality of fuses programmed in accordance with an address of a defective cell.

6. The semiconductor memory device of claim 3, wherein each of said latch cells comprises first and second inverters which form a closed circuit, wherein an input port of the first inverter is coupled to an output port of the second inverter and an input port of the second inverter is connected to an output port of the first inverter.

7. A semiconductor memory device including memory cell blocks each having a plurality of arrayed memory cells, each of the memory cell blocks having DQ blocks each sharing a predetermined number of data lines, data being selectively input to and output from the memory cells within the DQ blocks via the data lines, the semiconductor memory device comprising:

latch cells arranged in parallel, along the data lines;

fuse boxes each having a plurality of fuses which are programmed in accordance with a defective cell address;

latch cell control units that generate latch cell selection signals in response to an output signal of each of the fuse boxes, to select the latch cells; and switch units that connect the selected latch cells to the data lines in response to the latch cell selection signals, defective cells being replaced by at least two latch cells connected in parallel to each other along each of the data lines, using at least one fuse box.

8. The semiconductor memory device of claim 7, wherein defective memory cells within each of the DQ blocks of each of the memory blocks are replaced by the latch cells one at a time.

9. The semiconductor memory device of claim 7, wherein each of the fuse boxes comprises:

a redundancy enable unit that generates a fuse enable signal in response to a power-up signal that represents a power state of the semiconductor memory device, when a main fuse in said redundancy enable unit is cut; and a redundancy coding unit coupled to said redundancy enable unit, said redundancy coding unit generating a redundancy selection signal in response to the fuse enable signal and based on the plurality of fuses programmed in accordance with an address of a defective cell.

10. The semiconductor memory device of claim 7, wherein each of the fuse boxes includes a row fuse box and a column fuse box which are connected to a row address and a column address, respectively.

11. The semiconductor memory device of claim 7, wherein each of said latch cells comprises first and second inverters which form a closed circuit, an input port of the first inverter being connected to an output port of the second inverter and an input port of the second inverter being connected to an output port of the first inverter.

12. A semiconductor memory device comprising:

a plurality of memory blocks each including a memory cell array having memory cells arranged in columns and rows;

a plurality of data lines coupled to said plurality of memory blocks, data being input to and output from the memory cells via said plurality of data lines; and a redundancy circuit coupled to said plurality of data lines including latch cells, and latch cell controllers that selectively couple the latch cells to said plurality of data lines to replace defective memory cells within corresponding memory cell arrays, wherein only defective memory cells within respective columns and rows of the corresponding memory cell arrays are replaced.

13. The semiconductor memory device of claim 12, wherein said redundancy circuit further comprises a plurality of switches coupled between the latch cells and said plurality of data lines, said latch cell controllers selectively actuating the plurality of switches in accordance with addresses of the defective memory cells to couple the latch cells to said plurality of data lines.

14. The semiconductor memory device of claim 13, wherein said latch cell controllers comprise a plurality of fuse boxes programmable in accordance with the addresses of the defective memory cells to generate selection signals that selectively actuate the plurality of switches.

15. The semiconductor memory device of claim 14, wherein each of the fuse boxes comprises a row fuse box and a column fuse box respectively coupled to a row address and a column address of a memory cell to be accessed.

16. The semiconductor memory device of claim 12, wherein a defective memory cell is replaced with at least two latch cells coupled in parallel with each other.

17. The semiconductor memory device of claim 12, wherein the latch cells each comprise first and second inverters forming a loop circuit, an input of the first inverter being coupled to an output of the second inverter and an input of the second inverter being coupled to an output of the first inverter.

18. The semiconductor memory device of claim 12, wherein the device is a dynamic random access memory device.

\* \* \* \* \*